US006838117B2

(12) United States Patent
Kawamoto

(10) Patent No.: US 6,838,117 B2
(45) Date of Patent: Jan. 4, 2005

(54) FILM PRODUCTION METHOD AND FILM-ELEMENT PRODUCTION METHOD

(75) Inventor: Mitsutoshi Kawamoto, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/346,074

(22) Filed: Jan. 17, 2003

(65) Prior Publication Data

US 2003/0143333 A1 Jul. 31, 2003

(30) Foreign Application Priority Data

Jan. 29, 2002 (JP) .......................................... 2002-019515

(51) Int. Cl.[7] .............................. B05D 5/12; B05D 1/36; B05D 3/10
(52) U.S. Cl. .................... 427/126.3; 427/100; 427/58; 427/402; 427/419.1; 427/419.2; 427/343; 427/376.2; 427/430.1; 427/443.2

(58) Field of Search ................................ 427/126.3, 58, 427/402, 419.1, 419.2, 343, 376.2, 430.1, 443.2, 100

(56) References Cited

U.S. PATENT DOCUMENTS

| 5,886,717 | A | * | 3/1999 | Satake et al. .................. 347/70 |
| 6,350,486 | B2 | * | 2/2002 | Sakamaki et al. ........... 427/100 |
| 6,378,368 | B1 | * | 4/2002 | Iwata et al. .............. 73/504.14 |
| 6,455,106 | B1 | * | 9/2002 | Qiu et al. ................. 427/372.2 |

* cited by examiner

Primary Examiner—Michael Barr
(74) Attorney, Agent, or Firm—Dickstein, Shapiro, Morin & Oshinsky, LLP.

(57) ABSTRACT

A method for producing a lead ferroelectric film having high relative dielectric constant and low dielectric loss by a hydrothermal process is disclosed. The method includes the step of hydrothermally forming a ferroelectric layer on a substrate, followed by the step of hydrothermally treating the resulting film in an aqueous solution having a pH of about 5 to 7.

18 Claims, 1 Drawing Sheet

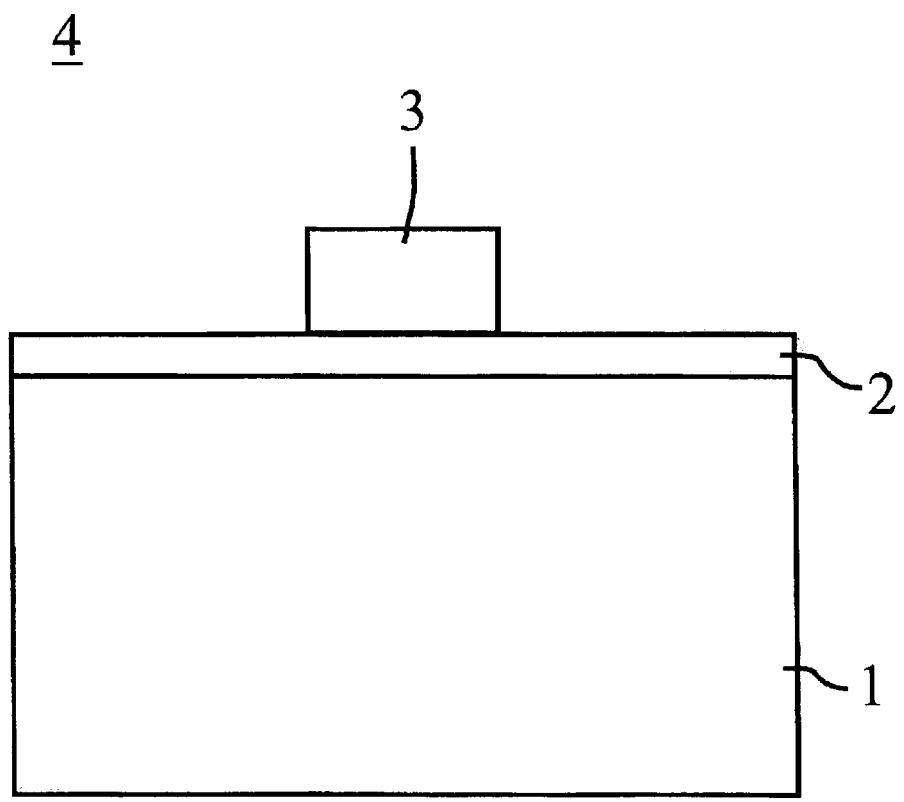

FILM PRODUCTION METHOD AND FILM-ELEMENT PRODUCTION METHOD

BACKGROUND OF THE INVENTION

1. Field of the Invention

The present invention relates to a film production method and a film-element production method. In particular, it relates to a method for producing a film by a hydrothermal process and to a method for making a film element including the film prepared by this method.

2. Description of the Related Art

Ferroelectric films for use in actuators and high-frequency devices are generally produced by a sol-gel method, a sputtering method, a metallorganic chemical vapor deposition (MOCVD) method, or the like. However, these methods have drawbacks. For example, only limited types of substrates can be used to form ferroelectric films; production of films having complex shapes is impossible; film production requires high temperature or heat-treatment after the film formation; the composition of the film is difficult to control; and the mass productivity is poor when thick films are to be produced.

Hydrothermal processes for producing ferroelectric films have been developed to overcome these drawbacks. However, no ferroelectric films which are suitable for practical use have been obtained by hydrothermal processes.

For example, Shimomura et al., Japanese Journal of Applied Physics, vol. 30, No. 9B, September 1991, pp. 2174–2177 disclose a method for producing a film composed of lead zirconate titanate (PZT), a typical ferroelectric material, by a hydrothermal method. An outline of this method is described below.

First, a titanium substrate having surfaces oxidized by annealing at 700° C. for 1 hour is immersed in a solution containing 6.82 mmol of lead nitrate {$Pb(NO_3)_2$}, 2.73 mmol of zirconium oxychloride ($ZrOCl_2$), and 50 mmol of potassium hydroxide (KOH), and a hydrothermal reaction is performed at 150° C. for 24 hours to form a seed layer composed of lead zirconate (PZ) on the titanium substrate. Subsequently, the substrate with the PZ layer is immersed in a solution containing 6.82 mmol of lead nitrate {$Pb(NO_3)_2$}, 2.73 mmol of zirconium oxychloride ($ZrOCl_2$), 2.52 mmol of titanium tetrachloride ($TiCl_4$), and 50 mmol of potassium hydroxide, and a second hydrothermal reaction is performed at 120° C. for 48 hours to form a single-phase PZT film.

However, the relative dielectric constant of the PZT film prepared by the method described in the above article is 640, which is lower than that of PZT films prepared by general solid-phase methods. Moreover, the article indicates that the temperature characteristics of the capacitance exhibits thermal hysteresis, and that the dielectric loss is large due to an excessively small value of spontaneous polarization observed from the hysteresis.

SUMMARY OF THE INVENTION

An object of the present invention is to provide a method for producing a film that can overcome the above-described problems using a hydrothermal process. Another object of the present invention is to provide a method for producing a film element including the film prepared by this process.

An aspect of the present invention provides a film production method including a film forming step of forming a film having a composition containing at least one predetermined metal element on a substrate, the film forming step comprising immersing the substrate in an aqueous solution containing the predetermined metal element to hydrothermally form the film; and a hydrothermal treatment step of hydrothermally processing the resulting film in an aqueous solution having a pH of about 5 to 7.

Yet another aspect of the present invention provides a film production method including a film-forming step of forming a film containing lead zirconate titanate on a substrate comprising titanium and a hydrothermal treatment step of hydrothermally processing the resulting film in an aqueous solution having a pH of about 5 to 7. The film forming step includes the steps of immersing the substrate in an aqueous solution containing lead and zirconium and heating the immersed substrate to form $PbZrO_3$ seed crystals on the substrate; and hydrothermally treating the resulting substrate in an aqueous solution containing lead, zirconium, and titanium to allow the $PbZrO_3$ seed crystals to grow and form the film comprising lead zirconate titanate.

The present invention also provides a method for producing a film element including the film prepared as above, the method including the step of forming an electrode on the surface of the film.

Since the film which has been hydrothermally formed on the substrate is subsequently subjected to a hydrothermal treatment in an aqueous solution having a pH of about 5 to 7, excess components and unreacted substances that are included in the film can be removed, and the film can thus exhibit proper characteristics.

Particularly, when the present invention is applied to the production of PZT films, the relative dielectric constant of the film can be increased and the dielectric loss of the film can be decreased.

Accordingly, a film element having superior characteristics can be formed by forming an electrode on the surface of this film. For example, an electrode is formed on the surface of the PZT film to obtain a film element that can be used as an actuator or high-frequency device with superior dielectric characteristics.

BRIEF DESCRIPTION OF THE DRAWING

The FIGURE is a cross-sectional view of a film element according to an embodiment of the present invention.

DESCRIPTION OF THE PREFERRED EMBODIMENTS

The present invention will now be described in reference to the FIGURE. The FIGURE is a cross-sectional view of a film element 4 according to an embodiment of the present invention. The film element 4 is constituted from a substrate 1; a film 2 on the substrate 1, the film 2 having a composition including at least one predetermined metal element; and an electrode 3 formed on the film 2.

The film 2 is formed by a hydrothermal process. In particular, a substrate is immersed in an aqueous solution containing metal elements that constitute the film 2 so as to hydrothermally form the film 2 on the substrate 1. No limit is imposed as to the material of the substrate 1. Preferably, the substrate 1 contains at least one of the elements that constitute the film 2 to be formed.

No limit is imposed as to the composition containing metal elements for making the film 2. Examples of the composition include barium titanate ($BaTiO_3$) and modified substances thereof such as $(Ba, Ca)TiO_3$, $(Ba, Sr)TiO_3$, $Ba(Ti, Zr)O_3$, $Ba(Ti, Sn)O_3$, and $(Ba, Ca)(Ti, Zr)O_3$. If necessary, Mn, Nb, $SiO_2$ or the like may be added. Further examples of the composition include lead titanate (PT), lead zirconate (PZ), lead zirconate titanate (PZT), and lanthanum-doped zirconate titanate (PLZT). In this case, the composition may contain manganese, niobium, a rare earth element, or the like. Still other examples of the composition include potassium niobate ($KNbO_3$); potassium tantalate ($KTaO_3$); and potassium tantalate niobate ($K(Ta, Nb)O_3$).

In fabricating the film 2 composed of PZT on the substrate 1, for example, the substrate 1, preferably composed of titanium, is immersed in an aqueous solution containing lead and zirconium so as to form $PbZrO_3$ seed crystals on the substrate 1 by hydrothermal synthesis. Subsequently, the substrate 1 with seed crystals is subjected to hydrothermal synthesis in an aqueous solution containing lead, zirconium and titanium so as to allow the seed crystals to grow and form the film 2 composed of PZT.

Subsequently, the film 2 on the substrate 1 is subjected to hydrothermal treatment in an aqueous solution at a pH of about 5–7. By this step of performing hydrothermal treatment on the formed film using an aqueous solution of a predetermined pH, excess components and unreacted substances are removed, and the proper characteristics of the composition constituting the film 2 can be exhibited. For example, when the film 2 is composed of a ferroelectric material, the relative dielectric constant of the film 2 can be increased to 750 or more, and the dielectric loss can be reduced to less than 4%.

Next, a conductive film 3 is formed on the film 2. No limit is imposed as to the method for forming the conductive film 3 or as to the material of the conductive film 3. Considering the cost and the production efficiency, the conductive film 3 is, for example, formed by a sputtering method using silver, gold, platinum or the like.

The film element 4 made as described above is used as an actuator or a high-frequency device, for example.

The present invention will now be described by way of EXAMPLES.

EXAMPLE 1

A zirconium propoxide propanol solution (Zr: 1.56 mmol) and 46.64 g of isopropyl alcohol were placed in a polytetrafluoroethylene beaker. While stirring the solution in the beaker with an ultradisperser, aqueous lead nitrate (Pb: 7.8 mmol) and then aqueous potassium hydroxide (KOH: 96 mmol) were fed into the solution by a micro-tubing pump so as to obtain a mixed hydroxide slurry containing Pb and Zr.

A 40 mm×20 mm titanium foil, i.e., the substrate, having a thickness of 0.05 mm was prepared by cutting. The foil was tied on a 40 mm×20 mm×1 mm polytetrafluoroethylene board by a platinum wire and was installed on a mixing rod of a mixing autoclave.

Next, the beaker containing the mixed hydroxide slurry of lead and zirconium was installed in the mixing autoclave described above, and a hydrothermal reaction was performed at 180° C. for 48 hours during which the titanium foil was stirred at a rotational speed of 50 rpm. Upon completion of the reaction, ultrasonic cleaning in deionized water for 5 minutes was performed 2 to 3 times, followed by ultrasonic cleaning in acetone for 5 minutes and overnight air-drying. Hereinafter, these steps are referred to as the "first process".

Next, a zirconium propoxide propanol solution (Zr: 1.56 mmol), titanium isopropoxide (Ti: 1.44 mmol), and 46.31 g of isopropyl alcohol were placed in a polytetrafluoroethylene beaker. While stirring the solution in the beaker with an ultradisperser, aqueous lead nitrate (Pb: 3.6 mmol) and then aqueous potassium hydroxide (KOH: 96 mmol) were fed into the solution with a micro-tubing pump so as to obtain a mixed hydroxide slurry containing lead, zirconium and titanium.

The titanium foil prepared in the first process was tied on a 40 mm×20 mm×1 mm polytetrafluoroethylene board with a platinum wire and was installed on a mixing rod of a mixing autoclave.

Next, the beaker containing the mixed hydroxide slurry of lead, zirconium, and titanium was installed in the mixing autoclave described above, and a hydrothermal reaction was performed at 200° C. for 48 hours during which the titanium foil was stirred at a rotational speed of 50 rpm. Upon completion of the reaction, ultrasonic cleaning in deionized water for 5 minutes was performed 2 to 3 times, followed by ultrasonic cleaning in acetone for 5 minutes and overnight air-drying. Hereinafter, these steps are referred to as the "second process".

Next, the steps of the second process were repeated twice, hereinafter referred as the "third process" and the "fourth process", respectively.

The titanium foil with the film prepared in the fourth process was tied on a 40 mm×20 mm×1 mm polytetrafluoroethylene board with a platinum wire and was installed on a mixing rod of a mixing autoclave. A polytetrafluoroethylene beaker containing 200 cc of decarbonated water, the pH thereof being adjusted at 7.0, was installed in the mixing autoclave described above, and a hydrothermal reaction was performed at 180° C. for 24 hours during which the titanium foil was stirred at a rotational speed of 50 rpm. Upon completion of the reaction, ultrasonic cleaning in deionized water for 5 minutes was performed 2 to 3 times, followed by ultrasonic cleaning in acetone for 5 minutes and overnight air-drying. Hereinafter, these steps are referred to as the "hydrothermal treatment process after film formation".

The generated phases of the resulting film of EXAMPLE 1 were identified by X-ray diffraction. The film had a PZT single phase. The structure of the film was observed with a scanning electron microscope. The grain size was 1 to 2 $\mu$m, and the film thickness was approximately 2 $\mu$m.

The above-described titanium foil, i.e., the substrate, with the PZT film thereon was cut into a 5-mm square pieces, and a 1-mm-square silver partial electrode was formed on each piece by sputtering to prepare a film element. The dielectric characteristics of the film element were examined at 1 kHz and 1 V. The relative dielectric constant at room temperature was 770, which was higher than 750, and the dielectric loss was 3.7%, which was lower than 4%. These values are substantially the same as those of the PZT ceramics produced by solid-phase methods.

EXAMPLE 2

The first to fourth processes were performed as in EXAMPLE 1.

Next, the hydrothermal treatment process after film formation was performed as in EXAMPLE 1 but with deionized water having a pH of 6.7 instead of the decarbonated water having a pH of 7.0.

The generated phases of the resulting film of EXAMPLE 2 were identified by X-ray diffraction. The film had a PZT single phase. The structure of the film was observed with a scanning electron microscope. The grain size was 1 to 2 $\mu$m, and the film thickness was approximately 2 $\mu$m.

The dielectric characteristics of a film element using the film of EXAMPLE 2 were examined as in EXAMPLE 1.

The relative dielectric constant at room temperature was 780, which was higher than 750, and the dielectric loss was 3.5%, which was lower than 4%.

EXAMPLE 3

The first to fourth processes were performed as in EXAMPLE 1.

Next, the hydrothermal treatment process after film formation was performed as in EXAMPLE 1 but with aqueous acetic acid having a pH of 5.0 instead of the decarbonated water having a pH of 7.0.

The generated phases of the resulting film of EXAMPLE 3 were identified by X-ray diffraction. The film had a PZT single phase. The structure of the film was observed with a scanning electron microscope. The grain size was 1 to 2 µm, and the film thickness was approximately 2 µm.

The dielectric characteristics of a film element using the film of EXAMPLE 3 were examined as in EXAMPLE 1. The relative dielectric constant at room temperature was 750, and the dielectric loss was 3.6%, which was lower than 4%.

COMPARATIVE EXAMPLE 1

A film of COMPARATIVE EXAMPLE 1 was prepared as in EXAMPLE 1 but without the hydrothermal treatment process after film formation, i.e., after the fourth process step.

The generated phases of the resulting film of COMPARATIVE EXAMPLE 1 were identified by X-ray diffraction. The film had a PZT single phase. The structure of the film was observed with a scanning electron microscope. The grain size was 1 to 2 µm, and the film thickness was approximately 2 µm.

The dielectric characteristics of a film element using the film of COMPARATIVE EXAMPLE 1 were examined as in EXAMPLE 1. The dielectric loss was several tens percent. Some samples suffered short-circuiting during measuring.

COMPARATIVE EXAMPLE 2

The first to fourth processes were performed as in EXAMPLE 1.

Next, the hydrothermal treatment process after film formation was performed as in EXAMPLE 1 but with aqueous acetic acid having a pH of 4.5 instead of the decarbonated water having a pH of 7.0.

The generated phases of the resulting film of COMPARATIVE EXAMPLE 2 were identified by X-ray diffraction. The film had a PZT single phase. The structure of the film was observed with a scanning electron microscope. The grain size was 1 to 2 µm, and the thickness was approximately 2 µm.

The dielectric characteristics of a film element using the film of COMPARATIVE EXAMPLE 2 were examined as in EXAMPLE 1. The relative dielectric constant at room temperature was 400, which was lower than 750, and the dielectric loss was 4.0%.

COMPARATIVE EXAMPLE 3

The first to fourth processes were performed as in EXAMPLE 1.

Next, the hydrothermal treatment process after film formation was performed as in EXAMPLE 1 but with aqueous barium hydroxide having a pH of 8.0 instead of the decarbonated water having a pH of 7.0.

The generated phases of the resulting film of COMPARATIVE EXAMPLE 3 were identified by X-ray diffraction. The film had a PZT single phase. The structure of the film was observed with a scanning electron microscope. The grain size was 1 to 2 µm, and the film thickness was approximately 2 µm.

The dielectric characteristics of the PZT film of COMPARATIVE EXAMPLE 3 were examined as in EXAMPLE 1. The relative dielectric constant at room temperature was 770, and the dielectric loss was 10.0%, which was higher than 4%.

A comparison of EXAMPLES 1–3 with COMPARATIVE EXAMPLE 1 demonstrates that the dielectric loss significantly increases or short-circuiting occurs in the film prepared by a hydrothermal method but not subjected to another hydrothermal treatment after the film formation. This is presumably due to the presence of excess or unreacted PbO, or due to potassium included in KOH used as a mineralizer. The step of hydrothermal processing after film formation that removes excess or unreacted PbO or potassium is important in achieving proper film characteristics.

A comparison of EXAMPLES 1–3 with COMPARATIVE EXAMPLE 2 demonstrates that the relative dielectric constant decreases if the pH of the aqueous solution used in the hydrothermal process is smaller than about 5.

A comparison of EXAMPLES 1–3 with COMPARATIVE EXAMPLE 3 demonstrates that the dielectric loss of the film increases when the pH of the aqueous solution used in the hydrothermal process is larger than about 7.

It should be noted that no limit is imposed as to the applicable temperature and time period for the hydrothermal process after film formation in an aqueous solution having a predetermined pH. When a polytetrafluoroethylene beaker is used as in the EXAMPLES above, the temperature of the hydrothermal process is preferably 250° C or less, and more preferably 220° C. or less.

What is claimed is:

1. A film production method comprising:
    subjecting a hydrothermally formed film to hydrothermally processing in an aqueous solution having a pH of about 5 to 7.
2. A method according to claim 1, wherein the hydrothermally formed film comprises PZT.
3. A method according to claim 1, further comprising hydrothermally forming the film.
4. A method according to claim 3, wherein hydrothermally forming the film comprises forming a hydrothermal seed on a substrate and then subjecting the seeded substrate to hydrothermal film formation.
5. A method according to claim 4, further comprising the step of forming an electrode on the surface of the film.
6. A method according to claim 1, further comprising the step of forming an electrode on the surface of the film.
7. A method according to claim 6 wherein the hydrothermal treatment is conducted at a temperature of 250° C. or less.
8. A method according to claim 7 wherein the hydrothermal treatment is conducted at a temperature of 220° C. or less.
9. A film production method comprising:
    forming a ferroelectric seed film comprising at least one of the metals to be contained in a ferroelectric film on a substrate; immersing the substrate in an aqueous solution comprising the metal elements of the ferroelectric film to hydrothermally form a ferroelectric film; and hydrothermally processing the resulting ferroelectric film in an aqueous solution having a pH of about 5 to 7.

10. A method according to claim 9, wherein the substrate comprises a metal of the ferroelectric film formed.

11. A method according to claim 10, wherein
a substrate comprising titanium is immersed in an aqueous solution containing lead and zirconium and heated to form $PbZrO_3$ seed crystals on the substrate; and hydrothermally treating the resulting substrate in an aqueous solution containing lead, zirconium and titanium to allow the $PbZrO_3$ seed crystals to grow and form a film comprising lead zirconate titanate; and hydrothermally processing the resulting film in an aqueous solution having a pH of about 5 to 7.

12. A method according to claim 11 wherein the hydrothermal processing is conducted at a temperature of 250° C. or less.

13. A method according to claim 12 wherein the hydrothermal processing is conducted at a temperature of 220° C. or less.

14. A method according to claim 13, further comprising the step of forming an electrode on the surface of the film.

15. A method according to claim 12, further comprising the step of forming an electrode on the surface of the film.

16. A method according to claim 11, further comprising the step of forming an electrode on the surface of the film.

17. A method according to claim 14, wherein the electrode is formed on the surface of the film after the hydrothermal processing.

18. A method according to claim 5, wherein the electrode is formed on the surface of the film after the hydrothermal processing.

* * * * *